US009953717B2

(12) United States Patent
Sabde et al.

(10) Patent No.: US 9,953,717 B2
(45) Date of Patent: Apr. 24, 2018

(54) NAND STRUCTURE WITH TIER SELECT GATE TRANSISTORS

(71) Applicant: SANDISK TECHNOLOGIES LLC, Plano, TX (US)

(72) Inventors: Jagdish Sabde, Fremont, CA (US); Jayavel Pachamuthu, San Jose, CA (US); Peter Rabkin, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/292,548

(22) Filed: Oct. 13, 2016

(65) Prior Publication Data

US 2017/0287566 A1 Oct. 5, 2017

Related U.S. Application Data

(60) Provisional application No. 62/316,557, filed on Mar. 31, 2016.

(51) Int. Cl.
*G11C 16/34* (2006.01)
*G11C 16/04* (2006.01)
(Continued)

(52) U.S. Cl.
CPC ...... *G11C 16/3427* (2013.01); *G11C 11/5628* (2013.01); *G11C 11/5635* (2013.01);
(Continued)

(58) Field of Classification Search
CPC ............ G11C 16/3427; G11C 16/0483; G11C 16/0466; G11C 16/10; G11C 16/14; G11C 16/08
(Continued)

(56) References Cited

U.S. PATENT DOCUMENTS

| 3,744,036 A | * | 7/1973 | Frohman-Bentchkowsky .. G11C 16/0433 257/322 |
| 5,291,440 A | * | 3/1994 | Koyama ............ G11C 16/0483 365/185.02 |

(Continued)

OTHER PUBLICATIONS

PCT International Search Report dated Apr. 5, 2017, PCT Patent Application PCT/US2017/017630.

(Continued)

*Primary Examiner* — Vu Le
*Assistant Examiner* — Sung Cho
(74) *Attorney, Agent, or Firm* — Vierra Magen Marcus LLP

(57) ABSTRACT

Systems and methods for improving performance of a non-volatile memory by utilizing one or more tier select gate transistors between different portions of a NAND string are described. A first memory string tier may comprise a first set of memory cell transistors that may be programmed to store a first set of data and a second memory string tier may comprise a second set of memory cell transistors that are arranged above the first set of transistors and that may be programmed to store a second set of data. Between the first set of memory cell transistors and the second set of memory cell transistors may comprise a tier select gate transistor in series with the first set of memory cell transistors and the second set of memory cell transistors. The tier select gate transistor may comprise a programmable transistor or a non-programmable transistor.

18 Claims, 17 Drawing Sheets

(51) Int. Cl.
  *G11C 16/10* (2006.01)
  *G11C 16/14* (2006.01)
  *G11C 16/08* (2006.01)
  *G11C 11/56* (2006.01)
  *G11C 16/16* (2006.01)

(52) U.S. Cl.
  CPC ...... *G11C 16/0466* (2013.01); *G11C 16/0483* (2013.01); *G11C 16/08* (2013.01); *G11C 16/10* (2013.01); *G11C 16/14* (2013.01); *G11C 16/16* (2013.01)

(58) Field of Classification Search
  USPC ............ 365/185.02, 185.05, 185.06, 185.11
  See application file for complete search history.

(56) References Cited

U.S. PATENT DOCUMENTS

| | | | | |
|---|---|---|---|---|
| 5,721,704 | A * | 2/1998 | Morton | G11C 16/08 365/185.23 |
| 6,295,227 | B1 | 9/2001 | Sakui | |
| 6,411,548 | B1 * | 6/2002 | Sakui | G11C 11/22 257/E27.103 |
| 6,850,439 | B1 | 2/2005 | Tanaka | |
| 6,906,376 | B1 * | 6/2005 | Hsu | G11C 16/0433 257/314 |
| 7,005,350 | B2 * | 2/2006 | Walker | H01L 27/115 257/344 |
| 7,505,321 | B2 * | 3/2009 | Scheuerlein | G11C 16/0483 365/185.11 |
| 8,760,957 | B2 * | 6/2014 | Lee | G11C 7/18 365/189.08 |
| 8,897,070 | B2 | 11/2014 | Dong | |
| 9,036,428 | B1 | 5/2015 | D'Abreu | |
| 2004/0213045 | A1 * | 10/2004 | Nakai | G11C 7/1051 365/185.13 |
| 2005/0117429 | A1 * | 6/2005 | Lin | G11C 7/1039 365/222 |
| 2005/0122780 | A1 * | 6/2005 | Chen | G11C 11/5671 365/185.17 |
| 2005/0184337 | A1 * | 8/2005 | Forbes | H01L 27/115 257/330 |
| 2005/0254302 | A1 * | 11/2005 | Noguchi | G11C 16/0483 365/185.17 |
| 2006/0146608 | A1 * | 7/2006 | Fasoli | G11C 16/0483 365/185.17 |
| 2006/0198195 | A1 * | 9/2006 | Hemink | G11C 16/0483 365/185.18 |
| 2007/0236993 | A1 | 10/2007 | Oowada | |
| 2007/0242515 | A1 | 10/2007 | Aritome | |
| 2007/0243680 | A1 * | 10/2007 | Harari | G11C 16/0483 438/257 |
| 2008/0007999 | A1 * | 1/2008 | Park | G11C 8/08 365/185.02 |
| 2008/0013359 | A1 * | 1/2008 | Fisch | G11C 7/12 365/72 |
| 2008/0171406 | A1 * | 7/2008 | Orimoto | H01L 27/115 438/129 |
| 2008/0205147 | A1 | 8/2008 | Santin | |
| 2009/0180317 | A1 | 7/2009 | Kang | |
| 2010/0157677 | A1 * | 6/2010 | Furuyama | G11C 16/0483 365/185.17 |
| 2011/0199825 | A1 | 8/2011 | Han | |
| 2013/0128667 | A1 * | 5/2013 | Lee | G11C 16/10 365/185.11 |
| 2014/0229654 | A1 * | 8/2014 | Goss | G06F 12/0246 711/103 |
| 2014/0289559 | A1 * | 9/2014 | Hashimoto | G11C 29/08 714/27 |
| 2014/0328128 | A1 * | 11/2014 | Louie | H01L 21/26586 365/185.17 |
| 2015/0016207 | A1 * | 1/2015 | Louie | G11C 5/148 365/229 |
| 2016/0027504 | A1 | 1/2016 | Lee | |
| 2016/0086671 | A1 | 3/2016 | Lee | |
| 2016/0172037 | A1 * | 6/2016 | Lee | G11C 15/046 365/185.12 |

OTHER PUBLICATIONS

PCT Written Opinion of the International Searching Authority dated Apr. 5, 2017, PCT Patent Application PCT/US2017/017630.

* cited by examiner

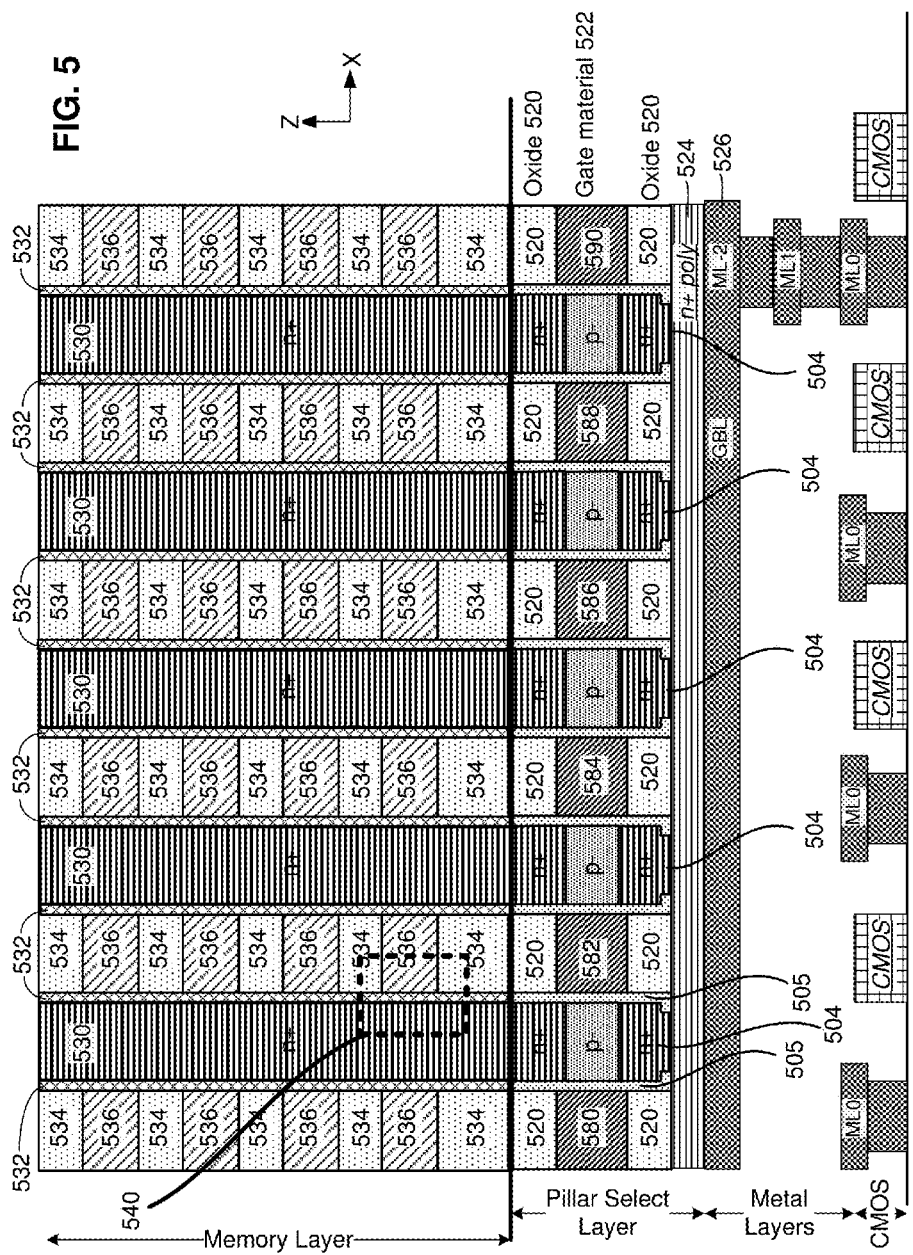

NAND STRUCTURE WITH TIER SELECT GATE TRANSISTORS

CLAIM OF PRIORITY

The present application claims priority to U.S. Provisional Application No. 62/316,557, entitled "NAND Structure With Tier Select Gate Transistors," filed Mar. 31, 2016, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature.

BRIEF DESCRIPTION OF THE DRAWINGS

FIG. 5 depicts a cross-sectional view of a memory structure using the vertically oriented select devices shown in FIG. 4.

DETAILED DESCRIPTION

Figure 1A:
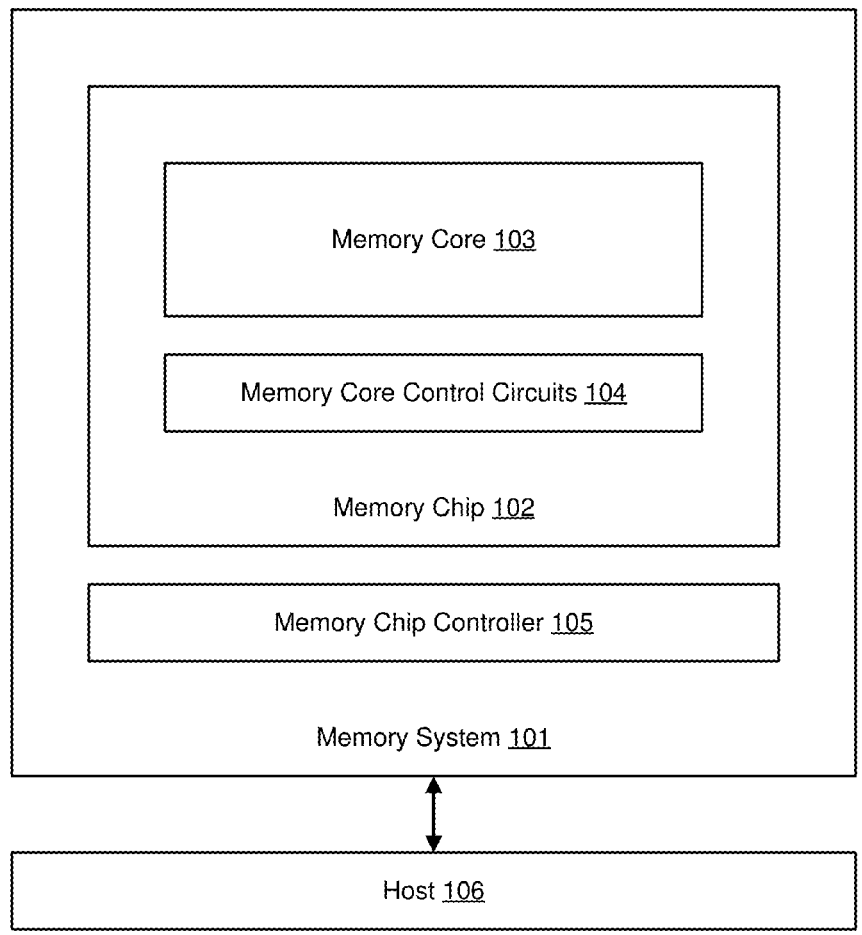
FIGS. 1A-1F depict various embodiments of a memory system.

Technology is described for improving performance and reliability of a non-volatile memory by utilizing one or more tier select gate transistors between different portions of a NAND structure. The NAND structure (e.g., a NAND string) may include two or more memory string tiers (e.g., two sub-strings) that may be electrically connected together or electrically isolated via one or more tier select gate transistors. The NAND structure may comprise a horizontal NAND structure or a vertical NAND structure, such as a Bit Cost Scalable (BiCS) NAND structure, that comprises two or more memory string tiers. The first memory string tier may comprise a first set of memory cell transistors (e.g., floating gate or charge trap transistors) that may be programmed to store a first set of data and the second memory string tier may comprise a second set of memory cell transistors that are arranged above the first set of transistors and that may be programmed to store a second set of data. Between the first set of memory cell transistors and the second set of memory cell transistors may comprise a tier select gate transistor in series with the first set of memory cell transistors and the second set of memory cell transistors. The tier select gate transistor may comprise a programmable transistor (e.g., a floating gate transistor or a charge trap transistor) or a non-programmable transistor (e.g., an NMOS transistor, a PMOS transistor, or a transistor without a charge trap layer to modify the transistor threshold voltage of the transistor).

The tier select gate transistor may have a first transistor channel length that is different from the transistor channel lengths used for the first set of memory cell transistors and/or the second set of memory cell transistors. The first channel length may be greater than any of the transistor channel lengths used for the first set of memory cell transistors and the second set of memory cell transistors. For example, the first channel length may be three times greater than the transistor channel lengths used for the first set of memory cell transistors and the second set of memory cell transistors. A longer transistor channel length may help to reduce or suppress short-channel effects, such as variability in transistor threshold voltage, drain-induced barrier lowering, and velocity saturation. The two or more memory string tiers may correspond with two or more sub-strings of a NAND string that may be selectively electrically connected to each other via one or more tier select gate transistors arranged between the two or more sub-strings. The NAND string may connect to a bit line at a drain-side end of the NAND string and a source line at a source-side end of the NAND string. A first sub-string may directly connect to the bit line, a second sub-string may directly connect to the source line, and a tier select gate transistor may be directly connected to both the first sub-string and the second sub-string.

In some embodiments, a tier select gate transistor arranged between and in series with a first set of memory cell transistors and a second set of memory cell transistors may be fabricated to have a transistor channel length that is greater than the transistor channel length of a first memory cell transistor of the first set of memory cell transistors and the transistor channel length of a second memory cell transistor of the second set of memory cell transistors. In one embodiment, the number of transistors in the first set of memory cell transistors may be different from the number of transistors in the second set of memory cell transistors. For example, the first set of memory cell transistors may comprise 16 total transistors and the second set of memory cell transistors may comprise 32 total transistors or 8 total transistors.

One benefit of using a tier select gate transistor between a first set of memory cell transistors of a NAND string and a second set of memory cell transistors of the NAND string is that the first set of memory cell transistors may be isolated during programming and/or erase operations to reduce program disturb. In one example, one end of the first set of memory cell transistors may connect to a bit line while the other end of the first set of memory cell transistors is connected to the tier select gate transistor. In this case, the tier select gate transistor may electrically isolate the first set of memory cell transistors from the second set of memory cell transistors during programming and/or erase operations being performed to the first set of memory cell transistors. The tier select gate transistor may electrically connect the first set of memory cell transistors to the second set of memory cell transistors during programming and/or erase operations being performed to the second set of memory cell transistors. The tier select gate transistor may also electrically connect the first set of memory cell transistors to the second set of memory cell transistors during read operations being performed to the first set of memory cell transistors or the second set of memory cell transistors.

In some embodiments, two-sided partial block erase operations may be performed on a NAND string in which a source-side erase operation for erasing a second set of memory cell transistors from the source-side of the NAND string injects holes from a p-well and a drain-side erase operation for erasing a first set of memory cell transistors from the drain-side of the NAND string uses gate induced drain leakage (GIDL). In some cases, a tier select gate transistor arranged between the first set of memory cell transistors of the NAND string and the second set of memory cell transistors of the NAND string may be set into a non-conducting state during the source-side erase operation and/or the drain-side erase operation.

In some cases, a first portion of a NAND string may be connected to a bit line and a second portion of the NAND string may be connected to a source line. An isolation transistor may electrically disconnect the first portion of the NAND string from the second portion of the NAND string during a memory operation (e.g., a programming operation or an erase operation) based on the programmed data states of memory cell transistors within the first portion of the NAND string or the second portion of the NAND string. In some cases, after memory cells within the second portion of the NAND string are programmed, the threshold voltage distributions of memory cells previously programmed within the first portion of the NAND string may be shifted leading to program disturb. Moreover, the amount of shifting may be greater for programming states or threshold voltages associated with smaller threshold voltages. In one example, the threshold voltage distribution for a first programming state centered around 500 mV may shift more than the threshold voltage distribution for a second programming state centered around 1.2V. In one embodiment, a tier select gate transistor connecting a first tier and a second tier may be set into a non-conducting state if a memory cell within the second tier is being programmed. In another embodiment, a tier select gate transistor connecting a first tier and a second tier may be set into a non-conducting state if a memory cell within the second tier is being programmed and at least a threshold number of memory cells within the first tier have programming states below a particular threshold voltage (e.g., at least three memory cells within the first tier have threshold voltages below 1V). In another embodiment, the isolation transistor may electrically disconnect the first portion of the NAND string from the second portion of the NAND string during the memory operation if it is detected that a number of memory cell transistors of the second portion of the NAND string that store a particular programmed data state is greater than a particular number of memory cell transistors. In another embodiment, the isolation transistor may electrically disconnect the first portion of the NAND string from the second portion of the NAND string during the memory operation if it is detected that a lowest programmed data state stored within memory cell transistors of the second portion of the NAND string is less than a particular threshold voltage. In another embodiment, the isolation transistor may electrically disconnect the first portion of the NAND string from the second portion of the NAND string during the memory operation if it is detected that a highest programmed data state stored within memory cell transistors of the second portion of the NAND string is greater than a particular threshold voltage.

In some cases, a tier select gate transistor may be used to independently control different memory string tiers. In one example, a tier select gate transistor may allow a second memory string tier to be programmed while a first memory string tier is floated or set into an inactive state. In some cases, the first memory string tier may be floated or set into the inactive state if a minimum programmed data state stored within memory cells of the first memory string tier is greater than or above a threshold programming data state (e.g., the memory cells all store threshold voltages above 1.5V or 3V). In another example, a tier select gate transistor may allow a second memory string tier to be erased while a first memory string tier is floated or set into an inactive state. One issue with a NAND string is that programming a first set of memory cells of the NAND string may cause data stored within other memory cells of the NAND string to be disturbed or corrupted. The effects of program disturb may be increased as the number of memory cells within a NAND string are increased. Thus, there is a need for enabling the use of long string lengths (e.g., more than 48 transistors in a NAND string) to promote area efficiency and reduced memory die area while reducing or preventing program disturb.

In one embodiment, a NAND structure may include two or more memory sub-strings that may be electrically connected together or electrically isolated via one or more isolation devices. In some cases, the isolation device may comprise a transistor, a floating gate transistor, a charge trap transistor, a semiconductor switch, or an electrically controlled switch. In one example, an isolation device may correspond with a tier select gate transistor. The isolation device may comprise a transistor with a channel length that is different from the channel lengths of memory cell transistors within the NAND structure. In one example, the channel length of the isolation device may be three times that of the memory cell transistors.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
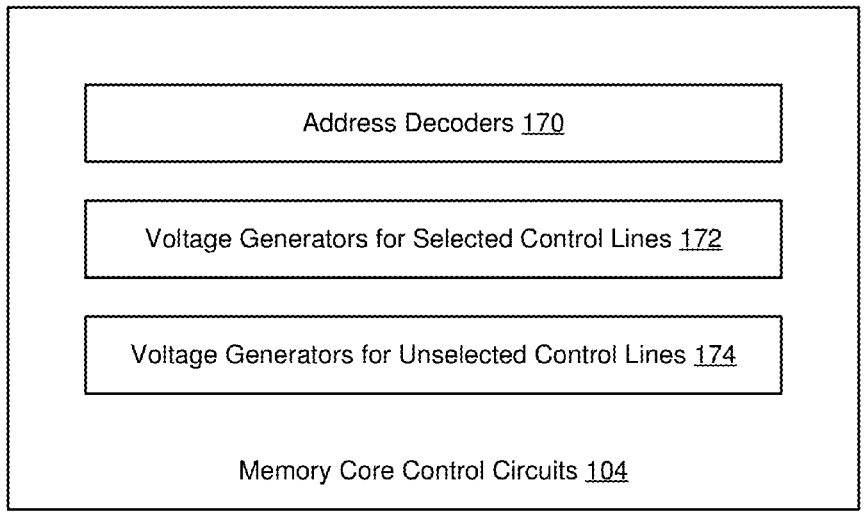

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
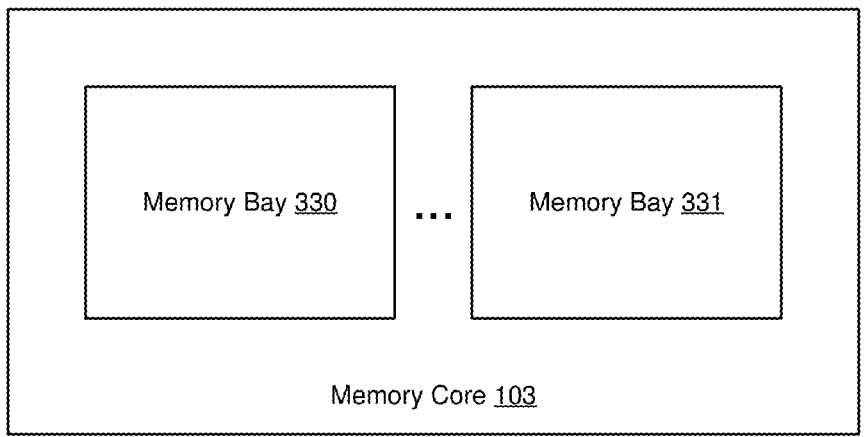

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
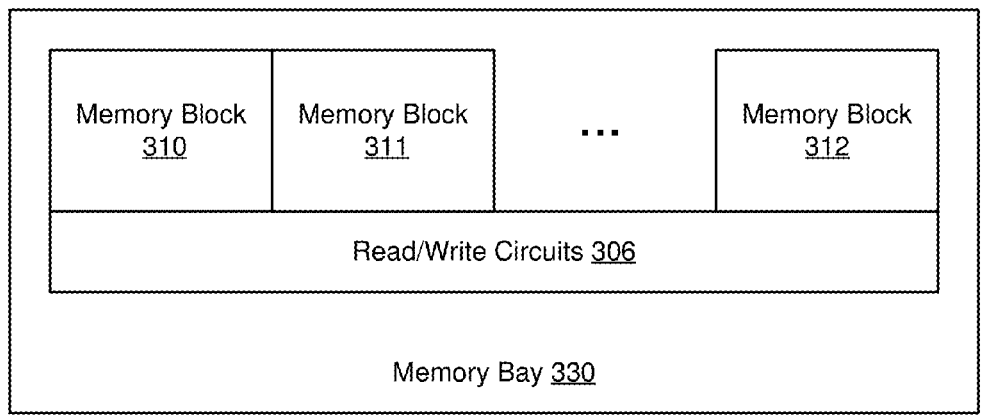

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
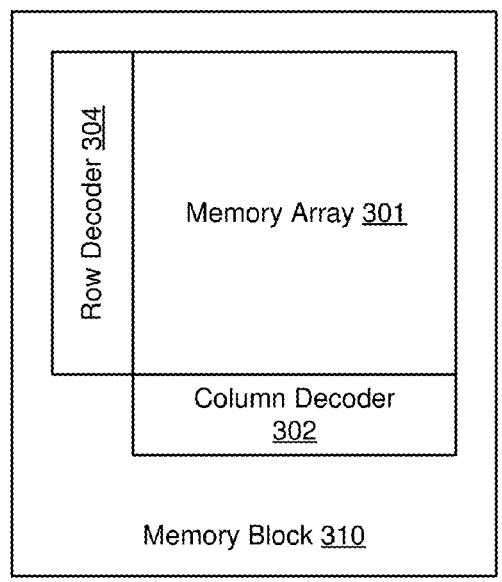

FIG. 1E depicts one embodiment of memory block 310 in FIG. 1D. As depicted, memory block 310 includes a memory array 301, row decoder 304, and column decoder 302.

Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
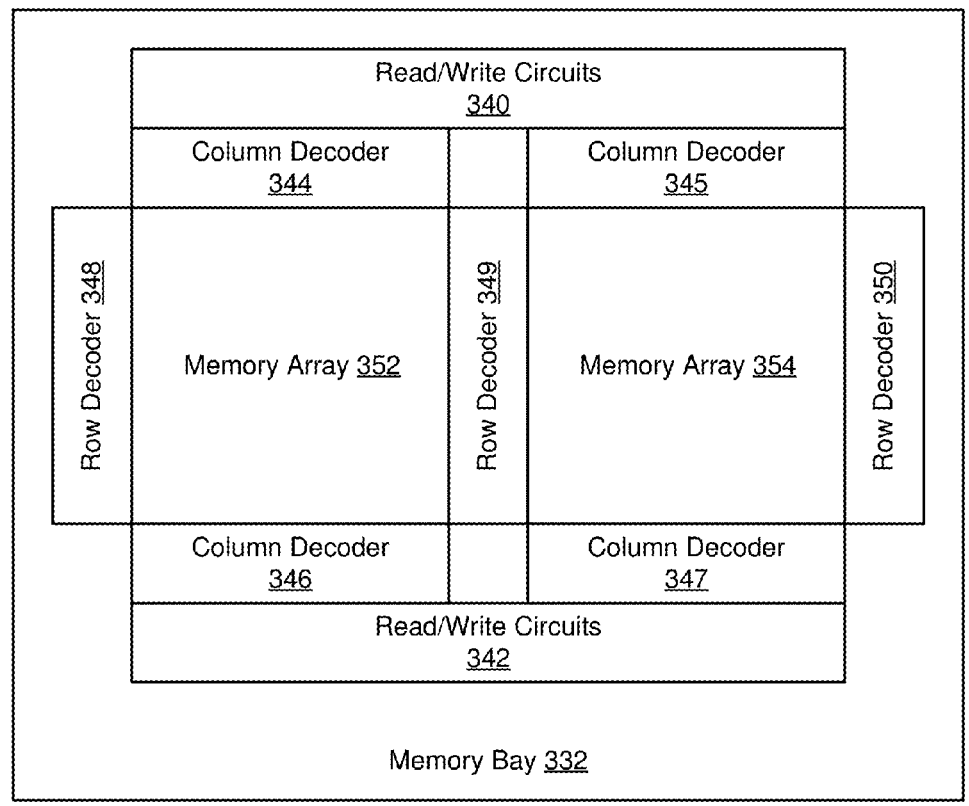

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2:
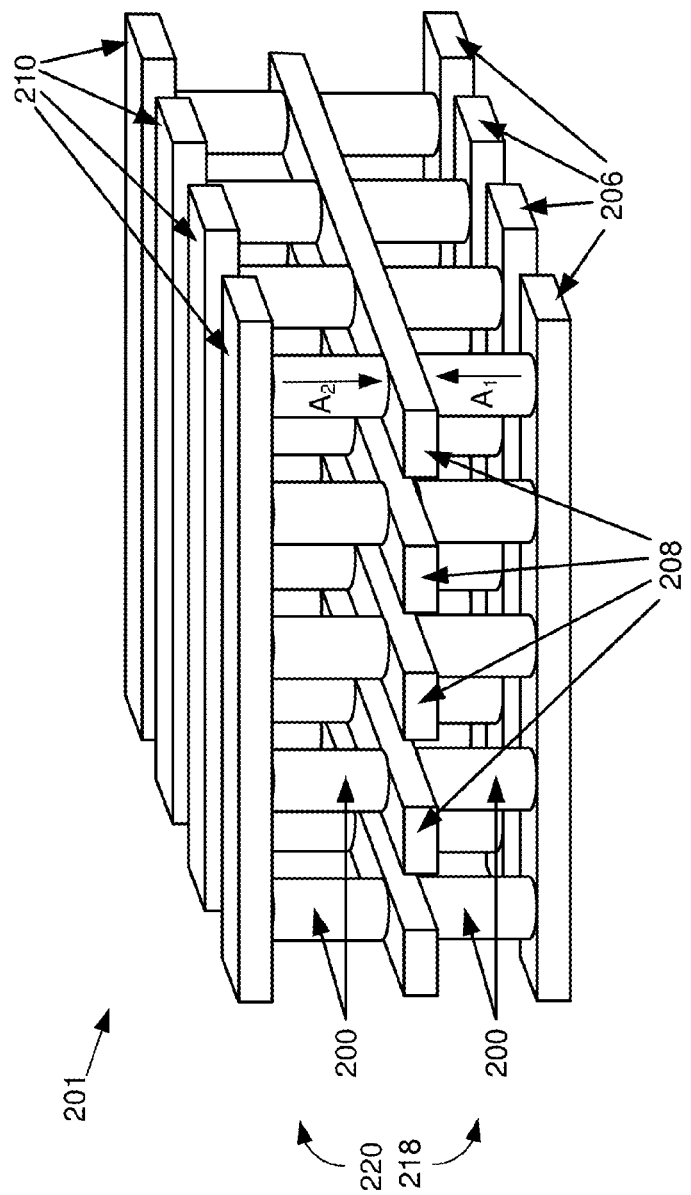
FIG. 2 depicts one embodiment of a portion of a monolithic three-dimensional memory array.

FIG. 2 depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2 may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

Figure 3:
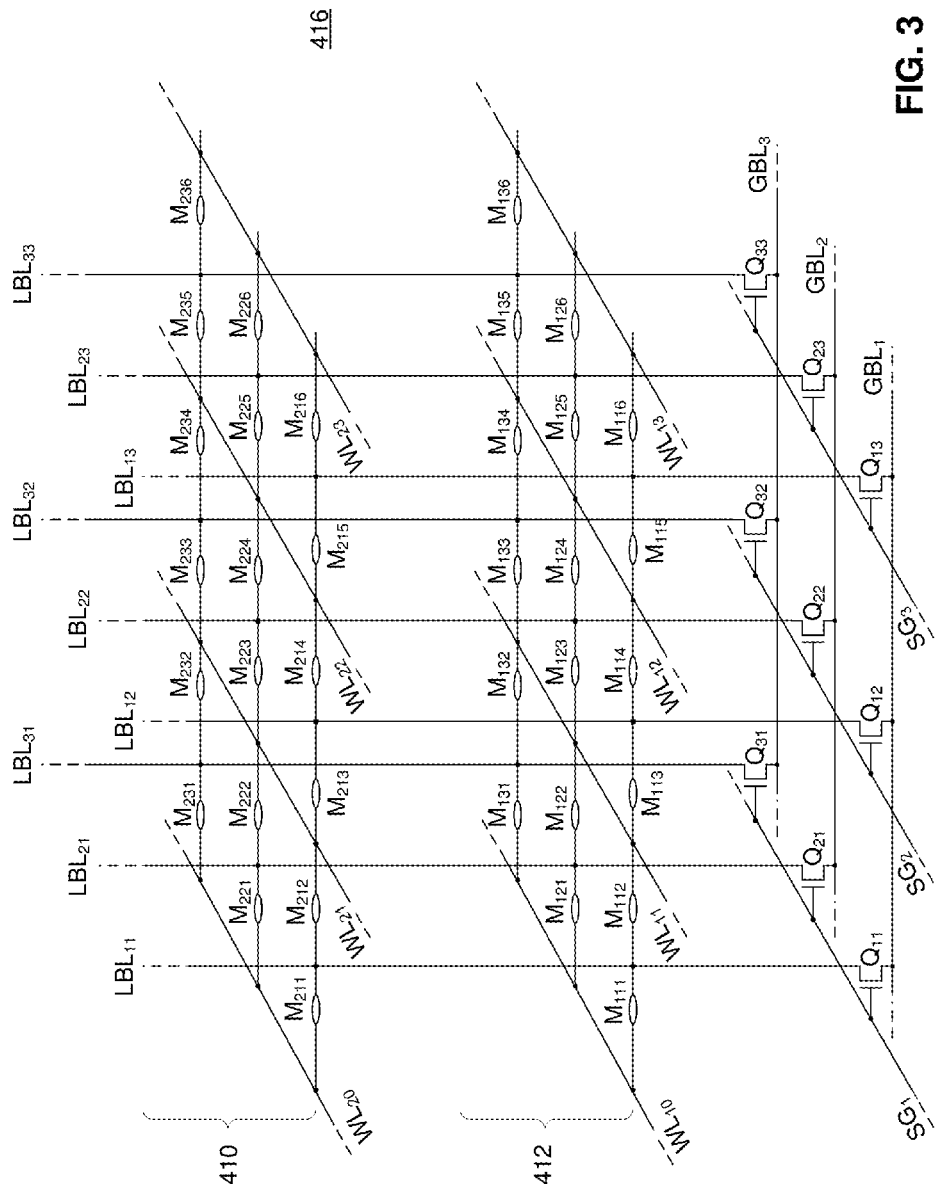
FIG. 3 depicts another embodiment of a portion of a monolithic three-dimensional memory array.

FIG. 3 depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4:
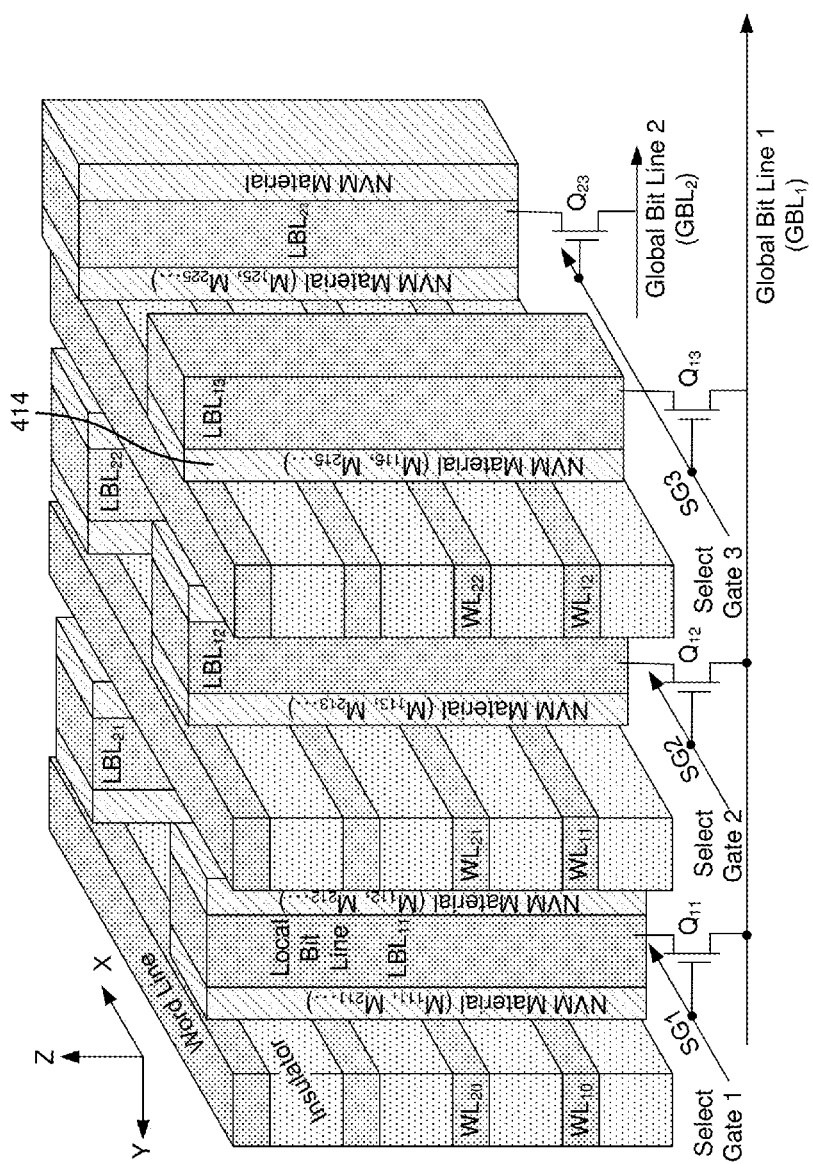
FIG. 4 depicts one embodiment of a portion of a monolithic three-dimensional memory array that includes vertical strips of a non-volatile memory material.

FIG. 4 depicts one embodiment of a portion of a monolithic three-dimensional memory array that includes vertical strips of a non-volatile memory material. The physical structure depicted in FIG. 4 may comprise one implementation for a portion of the monolithic three-dimensional memory array depicted in FIG. 3. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

FIG. 5 depicts a cross-sectional view of a memory structure using the vertically oriented select devices shown in FIG. 4. The memory structure of FIG. 5 may comprise a continuous mesh array of memory elements because there are memory elements connected to both sides of the bit lines and memory elements connected to both sides of the word lines. At the bottom of FIG. 5, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, ... of FIG. 4), which are labeled in FIG. 5 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p-/n+ TFT. Each of the vertically oriented select devices 504 have oxide layers 505 on each side. FIG. 5 also shows an n+ polysilicon layer 524. As depicted, the npn TFT of vertically oriented select devices 504 can be used to connect the global bit line GBL (layer 526) with any of the vertical bit lines 530.

Moreover, FIG. 5 shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 6A:
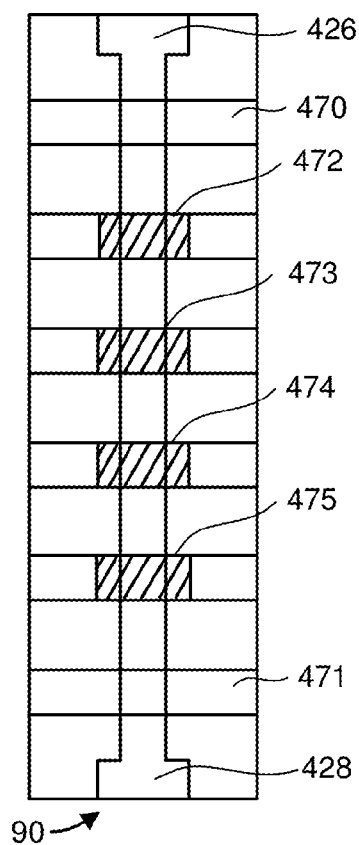
FIG. 6A depicts one embodiment of a NAND string.
Figure 6B:
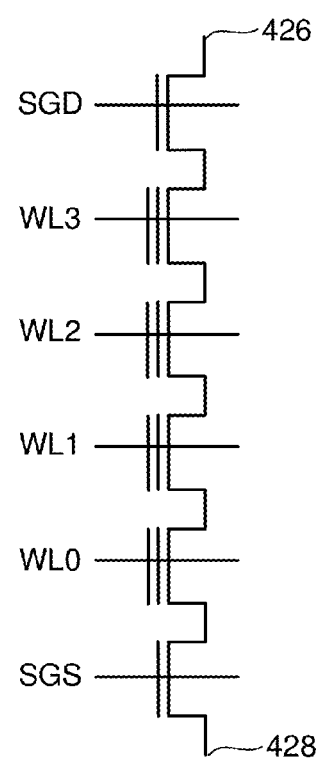
FIG. 6B depicts one embodiment of the NAND string of FIG. 6A using a corresponding circuit diagram.

FIG. 6A depicts one embodiment of a NAND string 90. FIG. 6B depicts one embodiment of the NAND string of FIG. 6A using a corresponding circuit diagram. As depicted, NAND string 90 includes four transistors 472-475 in series between a first select gate 470 (i.e., a drain-side select gate) and a second select gate 471 (i.e., a source-side select gate). Select gate 470 connects the NAND string 90 to a bit line 426 and is controlled by applying the appropriate voltage to the select line SGD. In this case, the bit line 426 is directly connected to the drain side end of the NAND string. Select gate 471 connects the NAND string 90 to a source line 428 and is controlled by applying the appropriate voltage to the select line SGS. In this case, the source line 428 is directly connected to the source-side end of the NAND string 90. The gates of transistors 472-475 are connected to word lines WL3, WL2, WL1, and WL0, respectively.

Note that although FIGS. 6A-6B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a p-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Figure 6C:
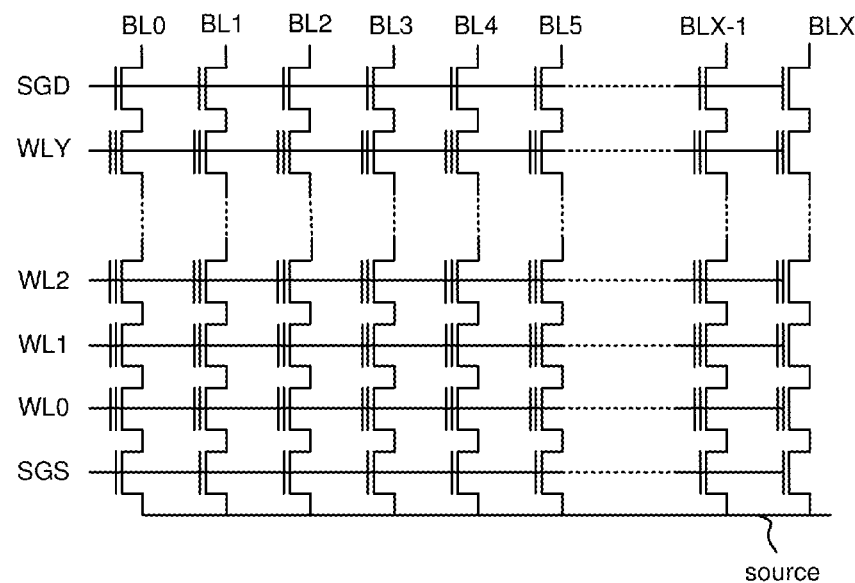
FIG. 6C depicts one embodiment of a memory block including a plurality of NAND strings.

FIG. 6C depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are several ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

In some cases, during a read operation or a sensing operation, the source-side selection signal SGS may be set to a particular voltage (e.g., 7V or 10V) to pass the voltage applied to the source line (source) to the source junction of the floating gate transistors whose gates are connected to WL0 or the word line closest to the source-side select gate.

Figure 6D:
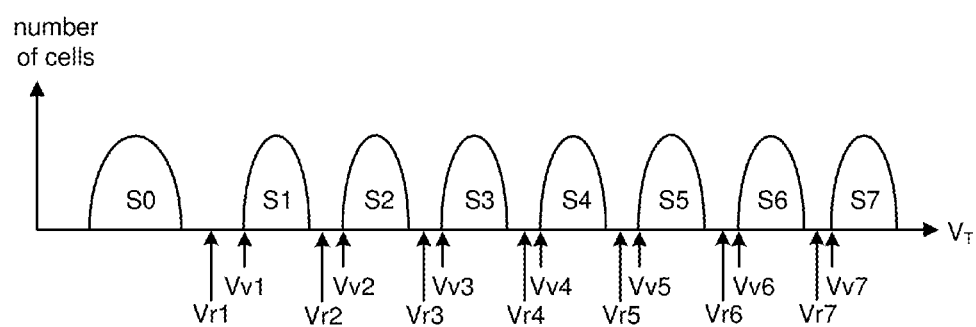
FIG. 6D depicts one embodiment of possible threshold voltage distributions (or data states) for a three-bit-per-cell memory cell.

FIG. 6D depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 7A:
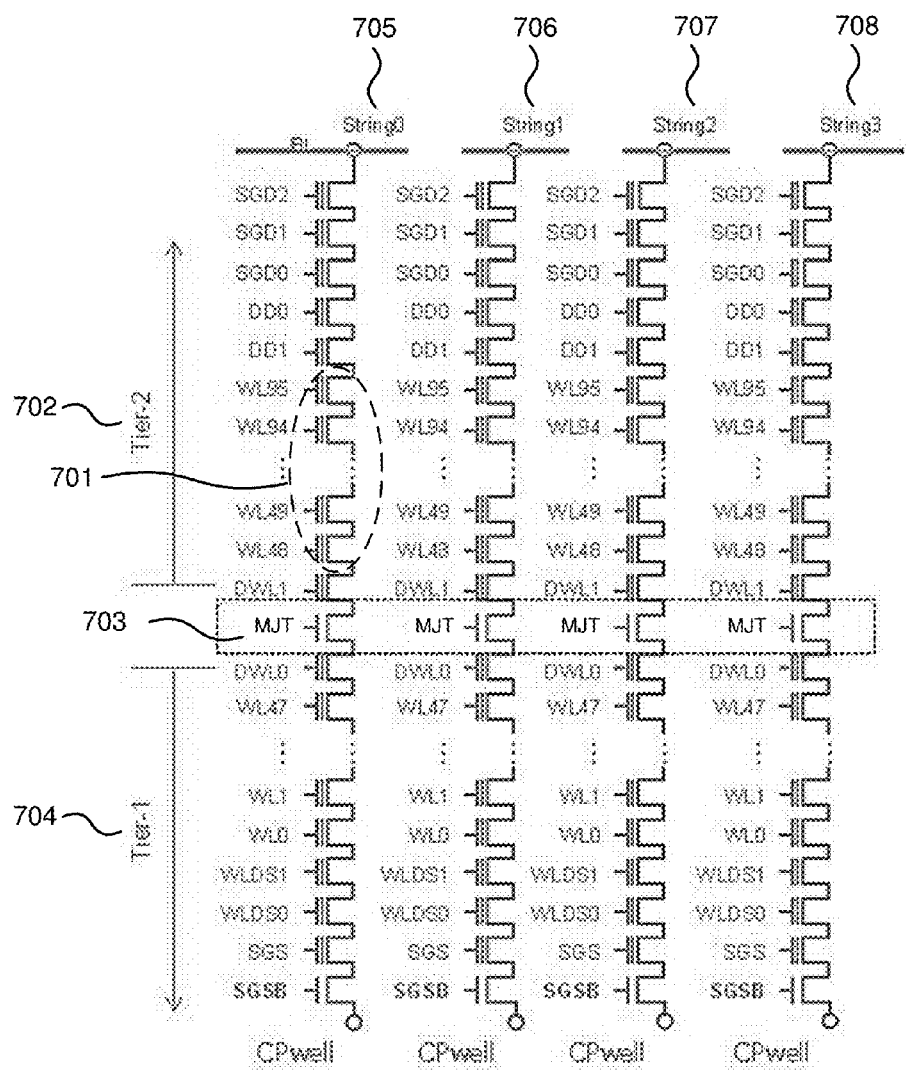
FIG. 7A depicts one embodiment of four NAND strings.

FIG. 7A depicts one embodiment of four NAND strings 705-708. Each of the NAND strings comprises a first portion of the NAND string (e.g., corresponding with a first tier of memory cell transistors 704), a second portion of the NAND string (e.g., corresponding with a second tier of memory cell transistors 702), and a tier select gate transistor 703 arranged between the first portion of the NAND string and the second portion of the NAND string. The first portion of the NAND string includes memory cell transistors corresponding with word lines WL0-WL47, a memory cell transistor connected to dummy word line DWL0 and arranged between the tier select gate transistor 703 and the memory cell transistor connected to word line WL47, and memory cell transistors connected to dummy word lines WLDS1 and WLDS0 and arranged between the memory cell transistor connected to word line WL0 and the source-side select gate connected to SGS.

In one embodiment, during a programming operation for memory cells within the first tier 704, the tier select gate transistor 703 may be placed into a conducting state while the memory cells within the first tier 704 are programmed. During a subsequent programming operation for memory cells within the second tier 702, the tier select gate transistor 703 may be placed into a non-conducting state while the memory cells 701 within the second tier 702 are programmed. In this case, the channel under the memory cells within the first tier 704 may be floated. The tier select gate transistor 703 may comprise an NMOS transistor without a charge trap layer between the channel of the NMOS transistor and the gate of the NMOS transistor. In another embodiment, during an erase operation for memory cells within the second tier 702, the tier select gate transistor 703 may be placed into a non-conducting state while the memory cells within the second tier 702 are erased.

Figure 7B:
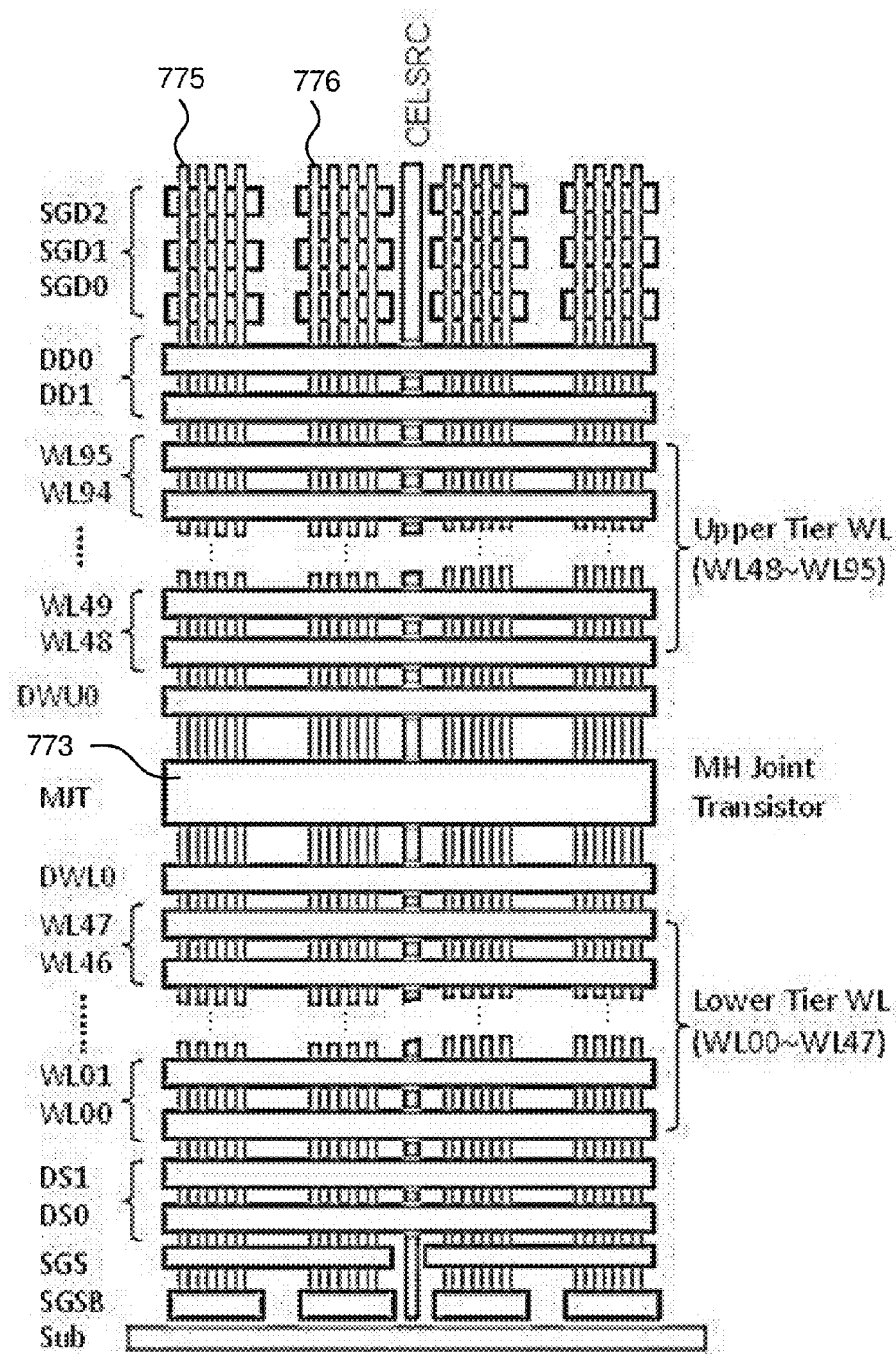
FIG. 7B depicts one embodiment of a NAND structure that includes four groups of memory strings.

FIG. 7B depicts one embodiment of a NAND structure that includes four groups of memory strings (including a first group 775 comprising four NAND strings and a second group 776 comprising four NAND strings). Each memory string includes a tier select gate transistor (or memory hole joint transistor) that may be used to electrically isolate a first set of memory cell transistors within the memory string (e.g., corresponding with the lower tier word lines WL00-WL47) from a second set of memory cell transistors within the memory string (e.g., corresponding with the upper tier word lines WL48-WL95) during a memory operation (e.g., an erase operation or a programming operation). The tier select gate transistors 773 may comprise programmable transistors, such as floating gate transistors or charge trap transistors, or non-programmable transistors, such as an NMOS transistor or a PMOS transistor. When a tier select gate transistor is set into a conducting state, then a bit line connected to a drain-side of a NAND string may be electrically connected to a channel formed under memory cell transistors of the lower tier. Each memory string within the four groups of memory strings may be connected to a different bit line.

Figure 7C:
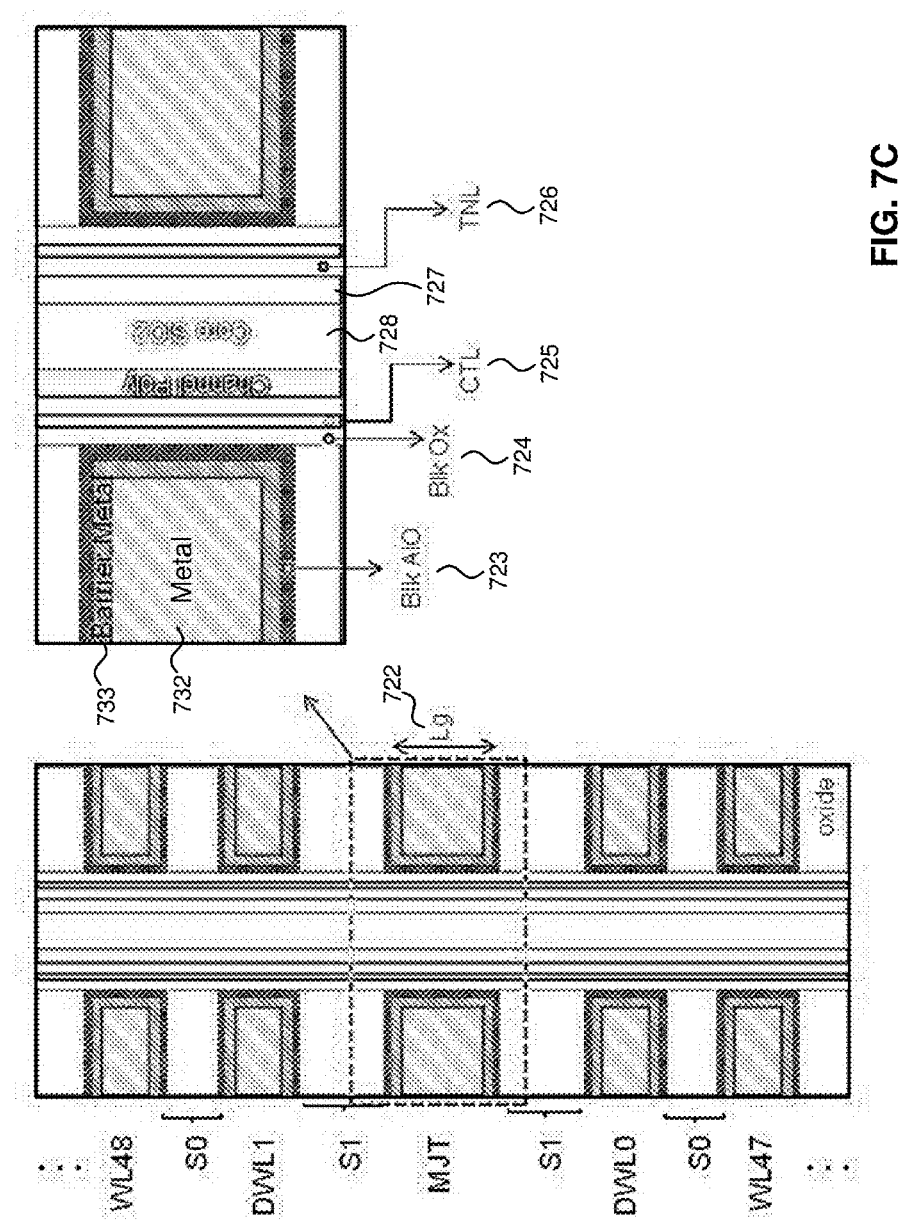
FIG. 7C depicts one embodiment of a NAND structure that includes a tier select gate transistor.

FIG. 7C depicts one embodiment of a NAND structure that includes a tier select gate transistor. As depicted, the tier select gate transistor may comprise a memory hole (MH) Joint Transistor (MJT). The MJT may comprise an NMOS transistor with a gate length Lg 722 and a channel length that is greater than those of the memory cell transistors within the NAND structure (e.g., corresponding with word lines WL47 and WL48). The MJT may be used for isolating transistors of the first tier while programming transistors of the second tier. A memory hole may be formed in which a vertical NAND string is fabricated. The vertical NAND string may include a layer of silicon dioxide (Core SiO2 728) surrounded by a layer of polysilicon (Channel Poly 727) surrounded by a tunneling layer TNL 726 surrounded by a charge trap layer CTL 725 (e.g., silicon nitride) surrounded by a blocking oxide Blk Ox 724. In this case, the gate of the tier select gate transistor may comprise a metal gate 732 with a barrier metal 733 or polysilicon gate and the channel length Lg of the tier select gate transistor may be greater than the channel length of the memory cell transistors (e.g., corresponding with word line WL47 and word line WL48). The tier select gate transistor may comprise a programmable device or a programmable isolation device. In one example, the channel length Lg of the tier select gate transistor may be 50 nm or 150 nm. One benefit of using a longer channel length is that short channel effects may be reduced. Moreover, the spacing between the tier select gate transistor and other transistors within the NAND string may be increased in order to reduce gate induced drain leakage (GIDL). For example, the spacing between the tier select gate transistor and an adjacent transistor may be 200 nm, while the spacing between other adjacent memory cell transistors within the NAND string may be 50 nm or 100 nm.

Figure 7D:
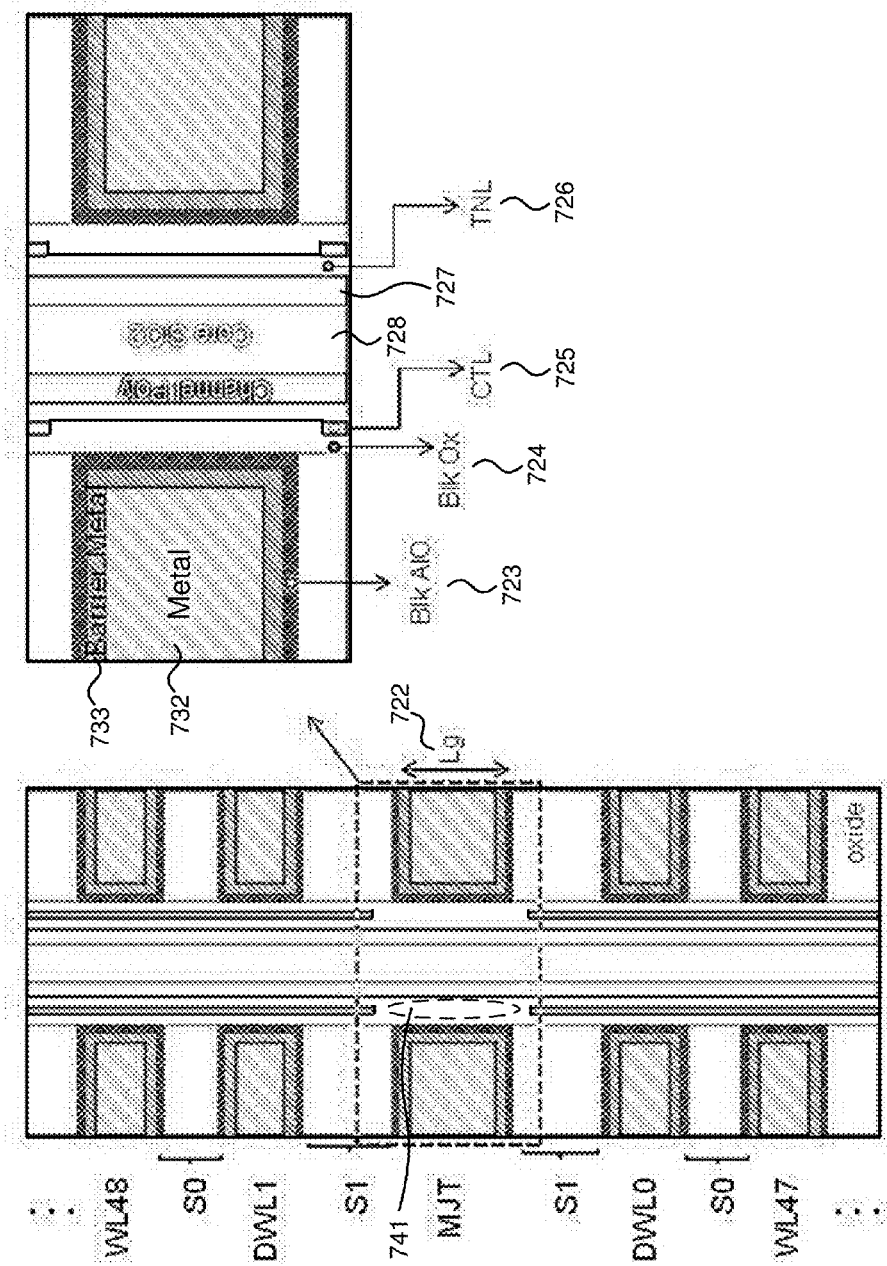
FIG. 7D depicts an alternative embodiment of a NAND structure that includes a tier select gate transistor.

FIG. 7D depicts an alternative embodiment of a NAND structure that includes a tier select gate transistor. As depicted, a memory hole may be etched and then a vertical NAND string may be fabricated in the memory hole. The vertical NAND string may include a layer of silicon dioxide (Core SiO2 728) surrounded by a layer of polysilicon (Channel Poly 727) surrounded by a tunneling layer TNL 726. However, in this case, the charge trap layer does not extend throughout the vertical NAND string and is not arranged between the channel of the tier select gate transistor and the gate of the tier selected transistor. For example, the tier select gate transistor does not include a charge trapping layer (e.g., a layer of silicon nitride) between the gate of the tier select gate transistor and the channel poly 727. The absence of a charge trapping layer within the region 741 of the tier select gate transistor may cause the transistor threshold voltage of the tier select gate transistor to be non-programmable. Thus, the tier select gate transistor may comprise a non-programmable transistor.

The gate of the tier select gate transistor may comprise a metal gate (as depicted) or a polysilicon gate and the channel length Lg of the tier select gate transistor may be greater than the channel length of the memory cell transistors (e.g., corresponding with word line WL47 and word line WL48). In one example, the channel length Lg of the tier select gate transistor may be between 30 nm and 150 nm. One benefit of using a longer channel length is that short channel effects may be reduced. Moreover, the spacing between the tier select gate transistor and other transistors within the NAND string may be set or increased in order to reduce gate induced drain leakage (GIDL) between the tier select gate transistor and its neighboring or adjacent transistors.

Figure 7E:
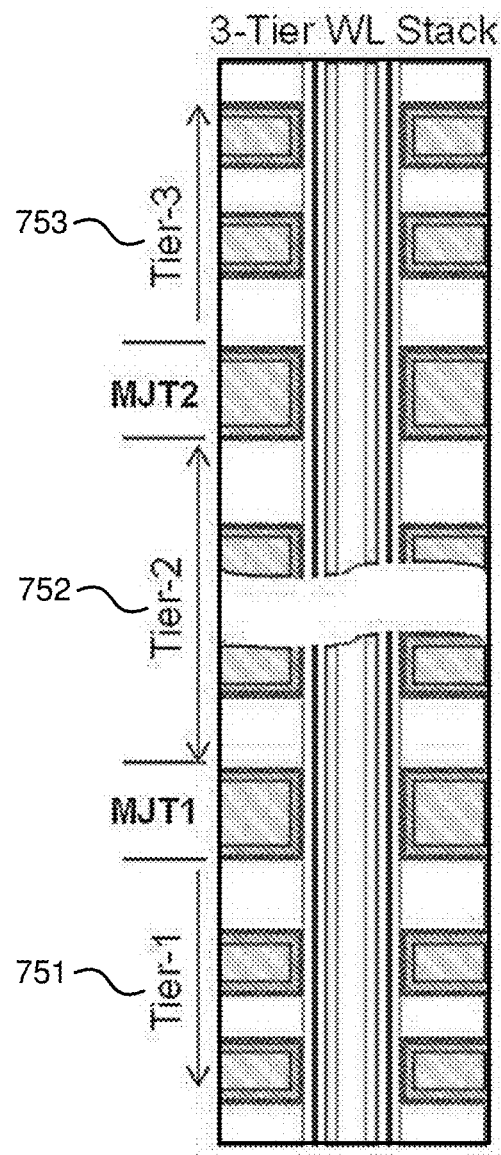
FIG. 7E depicts one embodiment of a portion of a NAND structure that includes two tier select gate transistors.

FIG. 7E depicts one embodiment of a portion of a NAND structure that includes two tier select gate transistors MJT1 and MJT2. As depicted, the portion of the NAND structure includes three tiers 751-753. A first tier select gate transistor driven by MJT1 is arranged between a first tier 751 (or a first sub-string of memory cell transistors) and a second tier 752 (or a second sub-string of memory cell transistors). A second tier select gate transistor driven by MJT2 is arranged between the second tier 752 and a third tier 753 (or a third sub-string of memory cell transistors). Although only three tiers are depicted, more than three tiers may be created by adding additional tier select gate transistors to the NAND structure.

Figure 7F:
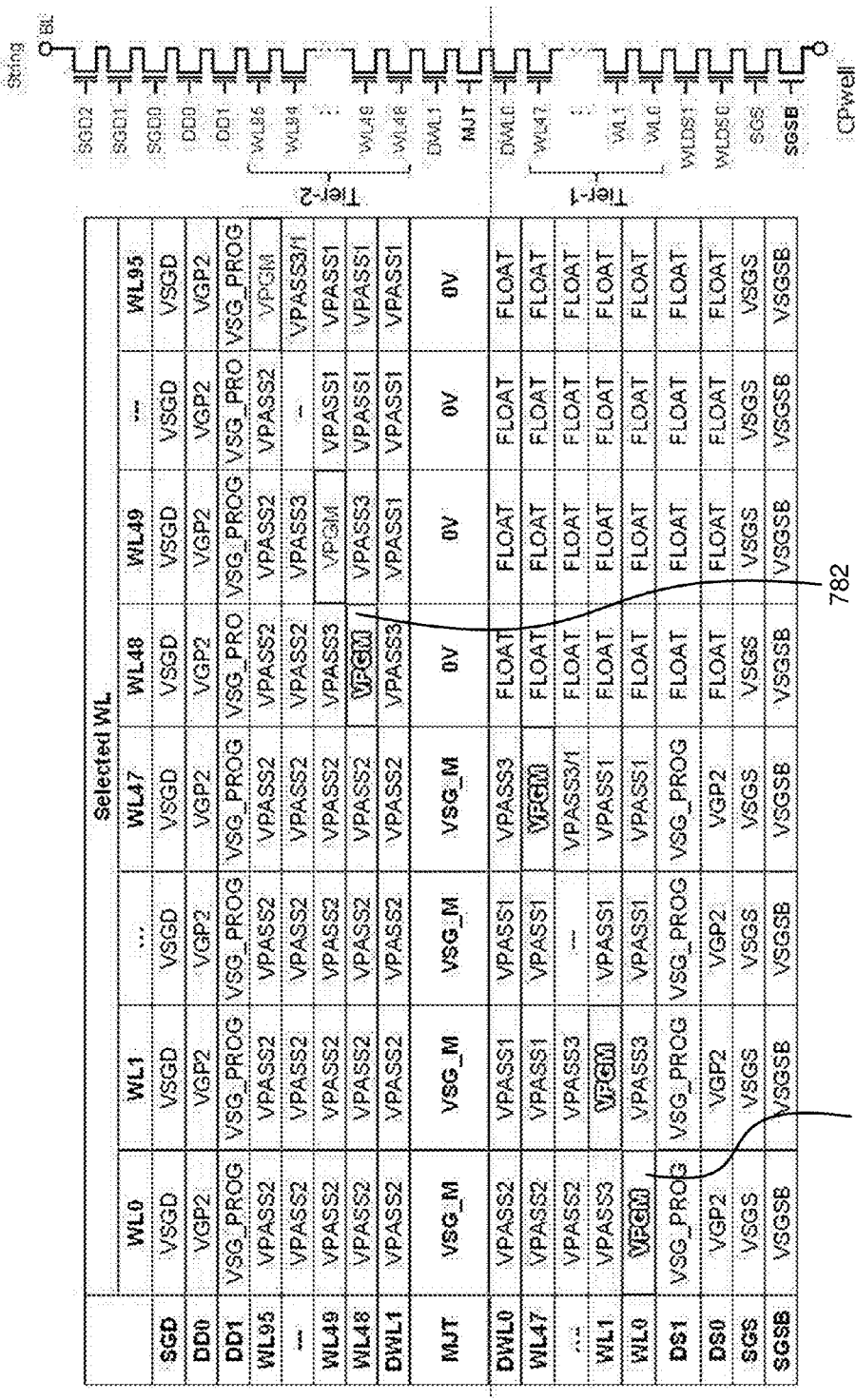
FIG. 7F depicts one embodiment of biasing conditions applied to word lines of a NAND structure that includes one or more tier select gate transistors.

FIG. 7F depicts one embodiment of biasing conditions applied to word lines of a NAND structure that includes one or more tier select gate transistors. As depicted, when programming 781 a memory cell within a first tier associated with word line WL0, VPGM (e.g., 15V) is applied to WL0 while the tier select gate transistor is set into a conducting state (e.g., VSG_M of 7V) and pass voltages are applied to unselected word lines WL1 through WL95. When programming 782 a memory cell within a second tier associated with word line WL48, VPGM is applied to WL48 while the tier select gate transistor is set into a non-conducting state (e.g., the gate of the tier select gate transistor is driven to 0V) and pass voltages are applied to unselected word lines WL49 through WL95 within the second tier. In this case, the transistors within the first tier may be electrically disconnected from the transistors within the second tier and the memory cell transistors within the first tier may be floated.

Figure 8:
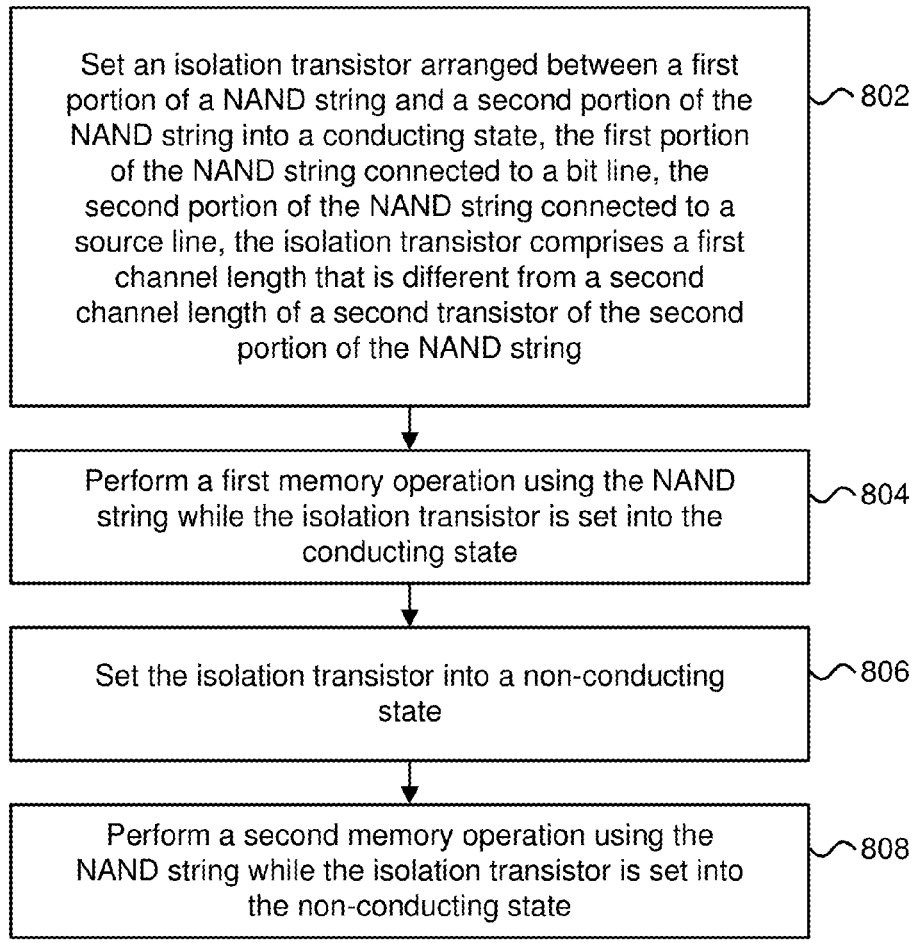
FIG. 8 is a flowchart describing one embodiment of a process for performing a memory operation using a NAND structure that includes one or more tier select gate transistors.

FIG. 8 is a flowchart describing one embodiment of a process for performing a memory operation using a NAND structure that includes one or more tier select gate transistors. In one embodiment, the process of FIG. 8 may be performed by a memory system, such as memory system 101 depicted in FIG. 1A.

In step 802, an isolation transistor (or other type of isolation device) arranged between a first portion of a NAND string and a second portion of the NAND string is set into a conducting state. The first portion of the NAND string may be connected to a bit line. The second portion of the NAND string may be connected to a source line. The isolation transistor may comprise a first channel length that is different from a second channel length of a second transistor of the second portion of the NAND string. In one example, the first channel length may be greater than the second channel length. The isolation transistor may comprise a first gate length that is different from a second gate length of a second transistor of the second portion of the NAND string. In one example, the first gate length may be greater than the second gate length. In step 804, a first memory operation is performed using the NAND string while the isolation transistor is set into the conducting state. In step 806, the isolation transistor is set into a non-conducting state. In step 808, a second memory operation is performed using the NAND string while the isolation transistor is set into the non-conducting state. The first memory operation may comprise a read operation and the second memory operation may comprise an erase operation or a programming operation.

One embodiment of the disclosed technology includes a first portion of a NAND string connected to a bit line, a second portion of the NAND string connected to a source line, and an isolation transistor configured to electrically disconnect the first portion of the NAND string from the second portion of the NAND string during a memory operation. The isolation transistor comprises a first channel length and the first portion of the NAND string comprises a second transistor with a second channel length different from the first channel length.

One embodiment of the disclosed technology includes a first set of memory cell transistors associated with a NAND string, a second set of memory cell transistors associated with the NAND string, and an isolation device (e.g., an NMOS transistor) arranged between the first set of memory cell transistors and the second set of memory cell transistors. The isolation device configured to electrically isolate the first set of memory cell transistors from the second set of memory cell transistors during a memory operation. In one embodiment, the isolation device comprises a first transistor with a first channel length and the first set of memory cell transistors comprises a second transistor with a second channel length less than the first channel length.

One embodiment of the disclosed technology includes setting a tier select gate transistor arranged between a first set of memory cell transistors of a NAND string and a second set of memory cell transistors of the NAND string into a non-conducting state during a memory operation and applying a selected word line voltage to a second memory cell transistor of the second set of memory cell transistors during the memory operation. The tier select gate transistor comprises a non-programmable transistor. The tier select gate transistor comprises a first channel length and the first set of memory cell transistors comprises a second transistor of a second channel length less than the first channel length.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a first portion of a NAND string connected to a bit line;
a second portion of the NAND string connected to a source line;
an isolation transistor configured to electrically disconnect the first portion of the NAND string from the second portion of the NAND string during a memory operation, the isolation transistor comprises a first channel length and the first portion of the NAND string comprises a second transistor with a second channel length different from the first channel length; and
a control circuit configured to detect that a programmed data state stored within memory cell transistors of the second portion of the NAND string is greater than a particular threshold voltage and cause the isolation transistor to electrically disconnect the first portion of the NAND string from the second portion of the NAND string during the memory operation in response to detection that the programmed data state is greater than the particular threshold voltage.

2. The apparatus of claim 1, wherein:
the second channel length is less than the first channel length.

3. The apparatus of claim 1, wherein:
the second transistor comprises a programmable transistor and the isolation transistor comprises a non-programmable transistor.

4. The apparatus of claim 1, wherein:
the first portion of the NAND string has a first string length and the second portion of the NAND string has a second string length different from the first string length.

5. The apparatus of claim 4, wherein:
the first string length is less than the second string length.

6. The apparatus of claim 1, wherein:
the memory operation comprises an erase operation.

7. The apparatus of claim 6, wherein:
a gate induced drain leakage current occurs within a channel of the first portion of the NAND string during the erase operation.

8. The apparatus of claim 1, wherein:
the memory operation comprises a programming operation; and
the second memory operation comprises a read operation.

9. The apparatus of claim 1, wherein:
the first portion of the NAND string is arranged above the second portion of the NAND string.

10. The apparatus of claim 1, wherein:
the second portion of the NAND string is floated during the memory operation.

11. The apparatus of claim 1, further comprising:
a third portion of the NAND string; and
a second isolation transistor configured to electrically connect the third portion of the NAND string to the first portion of the NAND string during the memory operation.

12. The apparatus of claim 1, wherein:
the second portion of the NAND string comprises a third transistor with a third channel length less than the first channel length.

13. An apparatus, comprising:
a first set of memory cell transistors associated with a NAND string;
a second set of memory cell transistors associated with the NAND string;
an isolation device arranged between the first set of memory cell transistors and the second set of memory cell transistors, the isolation device configured to electrically isolate the first set of memory cell transistors from the second set of memory cell transistors during a memory operation, the isolation device comprises a first transistor with a first channel length and the first set of memory cell transistors comprises a second transistor with a second channel length less than the first channel length; and
a control circuit configured to detect that a programmed data state stored within memory cell transistors of the second set of memory cell transistors is less than a particular threshold voltage and cause the isolation device to electrically isolate the first set of memory cell transistors from the second set of memory cell transistors during the memory operation in response to detection that the programmed data state is less than the particular threshold voltage.

14. The apparatus of claim 13, wherein:
the isolation device configured to electrically isolate the first set of memory cell transistors from the second set of memory cell transistors based on programmed data states of the first set of memory cell transistors.

15. The apparatus of claim 13, wherein:
the isolation device comprises an NMOS transistor.

16. The apparatus of claim 13, wherein:
the first set of memory cell transistors comprises a first number of transistors and the second set of memory cell transistors comprises a second number of transistors greater than the first number of transistors.

17. The apparatus of claim 13, wherein:
the memory operation comprises a programming operation;
the second memory operation comprises a read operation; and
the first set of memory cell transistors comprise charge trap transistors.

18. A method, comprising:
setting a tier select gate transistor arranged between a first set of memory cell transistors of a NAND string and a second set of memory cell transistors of the NAND string into a non-conducting state during a memory operation;
detecting that a programmed data state stored within memory cell transistors of the first set of memory cell transistors of the NAND string is greater than a particular threshold voltage and setting the tier select gate transistor into the non-conducting state during the memory operation in response to detecting that the programmed data state is greater than the particular threshold voltage;
applying a selected word line voltage to a second memory cell transistor of the second set of memory cell transistors during the memory operation, the tier select gate transistor comprises a non-programmable transistor, the tier select gate transistor comprises a first channel length and the first set of memory cell transistors comprises a first transistor of a second channel length less than the first channel length;
setting the tier select gate transistor arranged between the first set of memory cell transistors of the NAND string and the second set of memory cell transistors of the NAND string into a conducting state during a second memory operation; and
applying a second selected word line voltage to the second memory cell transistor of the second set of memory cell transistors during the second memory operation.

* * * * *